(12) United States Patent
Oh et al.

(10) Patent No.: US 12,707,172 B2
(45) Date of Patent: Aug. 11, 2026

(54) RAMP SIGNAL GENERATOR, IMAGE SENSOR INCLUDING THE SAME, AND OPERATING METHOD THEREOF

(71) Applicant: Samsung Electronics Co., Ltd., Suwon-si (KR)

(72) Inventors: Myeongjin Oh, Suwon-si (KR); Mooyoung Kim, Suwon-si (KR); Jaejung Park, Suwon-si (KR); Haneul Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 92 days.

(21) Appl. No.: 18/610,971

(22) Filed: Mar. 20, 2024

(65) Prior Publication Data

US 2024/0323570 A1 Sep. 26, 2024

(30) Foreign Application Priority Data

Mar. 24, 2023 (KR) ........................ 10-2023-0039193
Jul. 4, 2023 (KR) ........................ 10-2023-0086721

(51) Int. Cl.

| | |
|---|---|
| ***H04N 25/76*** | (2023.01) |
| ***H03K 4/06*** | (2006.01) |
| ***H04N 25/59*** | (2023.01) |
| ***H04N 25/77*** | (2023.01) |
| ***H04N 25/78*** | (2023.01) |

(52) U.S. Cl.
CPC ........... *H04N 25/7795* (2023.01); *H03K 4/06* (2013.01); *H04N 25/59* (2023.01); *H04N 25/78* (2023.01); *H04N 25/77* (2023.01)

(58) Field of Classification Search
CPC .... H04N 25/59; H04N 25/77; H04N 25/7795; H04N 25/78; H03K 4/06
See application file for complete search history.

(56) References Cited

U.S. PATENT DOCUMENTS

| | | | | |
|---|---|---|---|---|
| 8,339,300 | B2 | 12/2012 | Asayama et al. | |
| 9,686,494 | B2 | 6/2017 | Aibara | |
| 9,986,172 | B2 | 5/2018 | Aibara | |
| 10,547,318 | B2 | 1/2020 | Asayama et al. | |
| 11,431,939 | B1 | 8/2022 | Fan et al. | |
| 11,528,439 | B2 * | 12/2022 | Kim | H04N 25/709 |
| 2010/0253560 | A1 * | 10/2010 | Kudo | H03M 1/123 341/143 |
| 2021/0351768 | A1 | 11/2021 | Fan et al. | |

FOREIGN PATENT DOCUMENTS

KR 10-2021-0109769 A 9/2021

* cited by examiner

*Primary Examiner* — Lin Ye
*Assistant Examiner* — Chriss S Yoder, III
(74) *Attorney, Agent, or Firm* — Harness, Dickey & Pierce, P.L.C.

(57) ABSTRACT

A ramp signal generator includes a clock divider configured to generate a plurality of ramp clocks having different clocks, an output bit selector configured to select an output bit for reading out a pixel signal based on an analog gain of a ramp signal, a ramp clock controller configured to set a clock corresponding to the output bit, from among the plurality of ramp clocks, as a ramp clock, and a ramp offset controller configured to set an offset value corresponding to the output bit, from among a plurality of offset values, as a ramp offset value.

20 Claims, 14 Drawing Sheets

FIG. 6

| | LCG | HCG ((P+2) bit) | HCG ((P+3) bit) | HCG ((P+4) bit) |
|---|---|---|---|---|
| DCG | 1 | 0 | 0 | 0 |
| OPTION 1 | 0 | 0 | 1 | 0 |
| OPTION 2 | 0 | 0 | 0 | 1 |
| Analog Gain | A | A | A*2 | A*4 |
| RAMP Clock | CLK | CLK | CLK 1/2 | CLK 1/4 |
| OFFSET | X | X | X/2 | X/4 |

RAMP SIGNAL GENERATOR, IMAGE SENSOR INCLUDING THE SAME, AND OPERATING METHOD THEREOF

CROSS-REFERENCE TO RELATED APPLICATION

This application is based on and claims priority under 35 U.S.C. § 119 to Korean Patent Application Nos. 10-2023-0039193, filed on Mar. 24, 2023, and 10-2023-0086721, filed on Jul. 4, 2023 in the Korean Intellectual Property Office, the disclosures of which are incorporated by reference herein in their entireties.

BACKGROUND

The inventive concepts relate to image sensors including a ramp signal generator, and more particularly, to ramp signal generators capable of equally controlling auto-zero levels of ramp signals having different gains by adjusting the characteristics of the ramp signals and operating methods of the same.

An image sensor capable of capturing an image and converting the captured image into an electrical signal is used in a camera mounted in a vehicle, a security device, a robot, or a general consumer electronic device such as a digital camera, a mobile phone camera, or a portable camcorder. Image sensors may be classified into charge coupled device (CCD) image sensors and a complementary metal oxide semiconductor (CMOS) image sensors. The CMOS image sensor may include a plurality of two-dimensionally arranged pixels. The CMOS image sensor employs a correlated double sampling (CDS) method and uses a ramp signal to digitalize a difference between a reset signal sampled by the CDS method and an image signal into a digital signal. That is, the CMOS image sensor picks up a difference between the reset signal and the image signal varying according to external light illuminance, and generates a digital code value corresponding to the difference.

The larger a dynamic range, which is a range of brightness, the larger contrast of an image, and various readout methods have been implemented to improve image performance. For example, in a read-out method through an intra-scene dual conversion gain (DCG) mode, a dynamic range may be effectively extended by synthesizing and outputting two-pixel value data items obtained by reading out an optical signal integrated in a pixel twice as a high conversion gain (HCG) and a low conversion gain (LCG) at the same exposure time. However, in a process of changing a gain of a ramp signal, due to an auto-zero level difference between ramp signals having different gains (for example, a first ramp signal for reading out pixel value data based on the HCG and a second ramp signal for reading out pixel value data based on the LCG), an operational amplifier (OTA) electrically connected to a ramp signal generator in an image sensor requires additional settling time. In addition, a difference in an auto-zero level between ramp signals having different gains may cause an abnormal current/voltage fluctuation between the ramp signal generator and the OTA, resulting in performance deterioration of the entire image sensor.

SUMMARY

The inventive concepts relate to image sensors including a ramp signal generator capable of generating ramp signals of different gains with the same auto-zero level by dividing a clock of a ramp signal in a dual conversion gain (DCG) mode and operating methods of the ramp signal generator.

The inventive concepts relate to image sensors including a ramp signal generator capable of preventing or reducing an abnormal current/voltage fluctuation from occurring due to charge and discharge between the ramp signal generator and an operational amplifier (OTA) by dividing a clock of a ramp signal in a DCG mode to generate ramp signals of different gains having the same auto-zero level and methods of operating the same.

The inventive concepts relate to image sensors including a ramp signal generator capable of reducing a settling time of an OTA and a read-out time (for example, one horizontal scanning time (1H-time)) of a pixel signal by dividing a clock of a ramp signal in a DCG mode to extend a high dynamic range (HDR) based on a ramp signal having the same auto-zero level and methods of operating the same.

The problems to be solved by the technical ideas of the inventive concepts are not limited to the above-mentioned problems, and other problems not mentioned will be clearly understood by those skilled in the art from the following description.

According to some aspects of the inventive concepts, there is provided a ramp signal generator including a clock divider configured to generate a plurality of ramp clocks having different clocks, an output bit selector configured to select an output bit for reading out a pixel signal based on an analog gain of a ramp signal, a ramp clock controller configured to set a clock corresponding to the output bit among the plurality of ramp clocks as a selected ramp clock, and a ramp offset controller configured to set an offset value corresponding to the output bit among a plurality of offset values as a ramp offset value.

According to some aspects of the inventive concepts, there is provided an image sensor including a pixel array including a plurality of pixels, a ramp signal generator configured to generate ramp signals having different clocks according to a conversion gain mode, and a correlated double sampler configured to compare the ramp signal with an output signal of the pixel array and to output a comparison signal. The ramp signal generator outputs a first ramp signal in the HCG mode of the conversion gain mode and outputs a second ramp signal in the LCG mode of the conversion gain mode.

According to some aspects of the inventive concepts, there is provided a method of operating a ramp signal generator, including generating a plurality of ramp clocks having different clocks, selecting an output bit for reading out a pixel based on an analog gain in a conversion gain mode, setting a clock corresponding to the output bit among the plurality of ramp clocks as a selected ramp clock, setting an offset value corresponding to the output bit among a plurality of offset values as a ramp offset, and outputting a ramp signal having the selected ramp clock and the offset.

BRIEF DESCRIPTION OF THE DRAWINGS

Example embodiments will be more clearly understood from the following detailed description taken in conjunction with the accompanying drawings in which:

FIG. 6 is a diagram illustrating an example of an output according to an input applied to a ramp signal generator according to some example embodiments;

DETAILED DESCRIPTION

Hereinafter, example embodiments will be described with reference to the accompanying drawings. However, those skilled in the art will understand that the inventive concepts may be implemented in other specific forms without changing its technical spirit or essential features. Therefore, it should be understood that the example embodiments described below are illustrative in all respects and not restrictive.

Hereinafter, example embodiments of the inventive concepts will be described in detail with reference to the accompanying drawings.

In the current specification, an analog gain of a ramp signal may mean a slope gain of the ramp signal.

Figure 1:
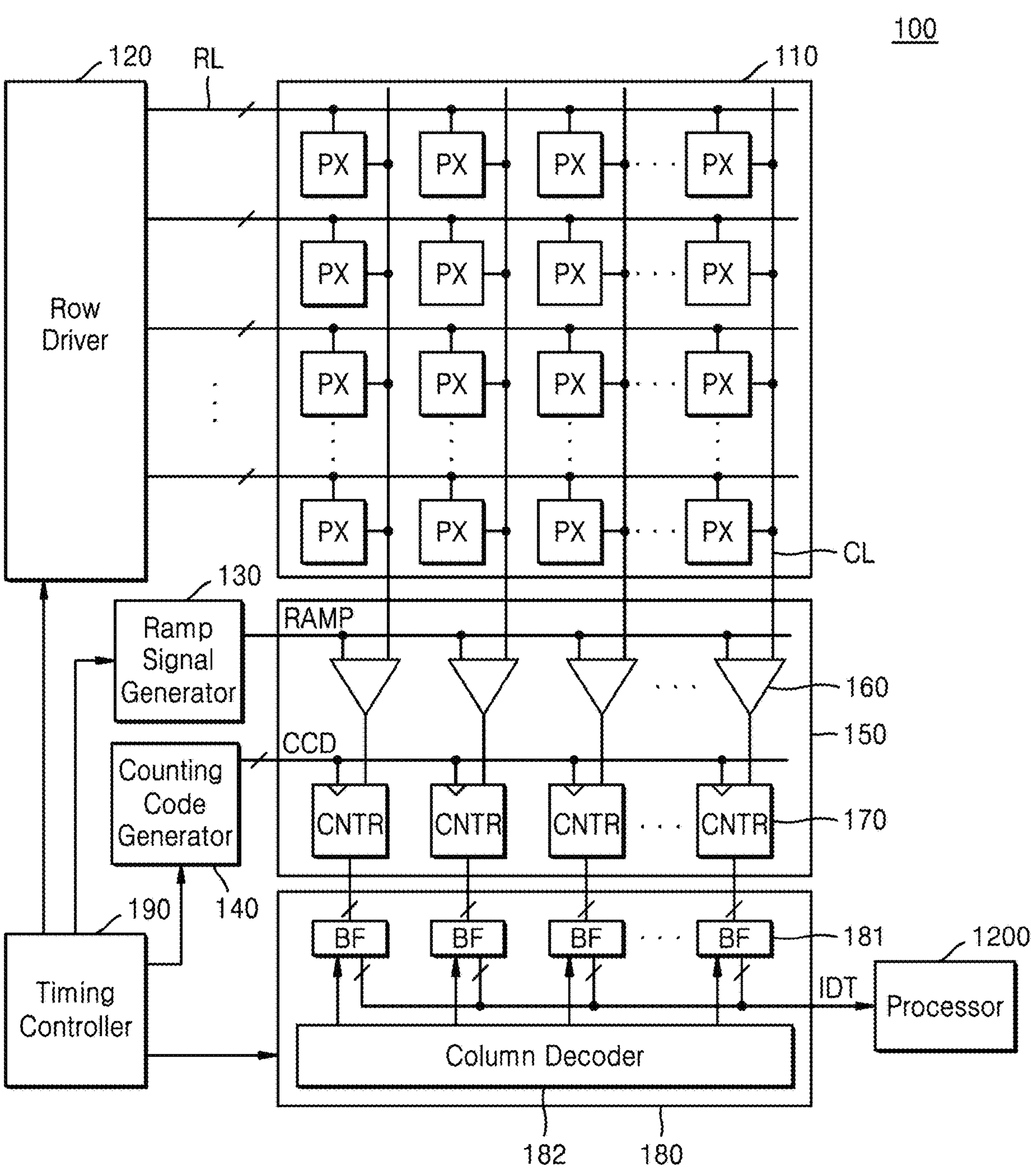
FIG. 1 is a block diagram schematically illustrating an image sensor according to some example embodiments.

FIG. 1 is a block diagram schematically illustrating an image sensor 100 according to some example embodiments.

The image sensor 100 according to the inventive concepts may include a complementary metal oxide semiconductor image sensor (CIS) configured to convert an optical signal into an electrical signal.

Referring to FIG. 1, the image sensor 100 may include a pixel array 110, a row driver 120, a ramp signal generator 130, a counting code generator 140, an analog-to-digital conversion (ADC) circuit 150, a data output circuit 180, and a timing controller 190. A configuration including the ADC circuit 150 and the data output circuit 180 may be referred to as a readout circuit. The pixel array 110 may include a plurality of row lines RL, a plurality of column lines CL, and a plurality of pixels PX. The plurality of pixels PX may be connected to the plurality of row lines RL and the plurality of column lines CL and may be arranged in a matrix.

Each of the plurality of pixels PX included in the pixel array 110 may include at least one photoelectric conversion element, may detect light by using the photoelectric conversion element, and may output an image signal that is an electrical signal in response to the detected light. For example, the photoelectric conversion element may include a photodiode, a phototransistor, a photogate, or a pinned photodiode. According to the inventive concepts, description will be made assuming that the photoelectric conversion element is a photodiode.

A microlens (not shown) for condensing light may be arranged on each pixel PX or on each pixel group including adjacent pixels PX. Each of the plurality of pixels PX may detect light in a specific spectral region from light received through the microlens arranged thereon. A color filter array for transmitting light in a specific spectral region may be arranged on the plurality of pixels PX, and a color that the corresponding pixel may detect may be determined according to the color filter arranged on each of the plurality of pixels.

In the pixel array 110 according to some example embodiments, the pixel PX may have a dual conversion gain (DCG). The DCG includes a low conversion gain (LCG) and a high conversion gain (HCG). A conversion gain refers to a rate at which charges accumulated in a floating diffusion node FD (refer to FIG. 2) are converted into a voltage. Charges generated by a photoelectric conversion element PD (refer to FIG. 2) are transmitted to and accumulated in the floating diffusion node FD, and the charges accumulated in the floating diffusion node FD may be converted into a voltage according to the conversion gain. At this time, the conversion gain may vary according to capacitance of the floating diffusion node FD, and when the capacitance increases, the conversion gain may decrease, and when the capacitance decreases, the conversion gain may increase.

The pixel PX may operate in the LCG mode in which capacitance of the floating diffusion node FD is high or in the HCG mode in which capacitance of the floating diffusion node FD is high. Although the charges accumulated in the floating diffusion node FD are the same, a voltage of the floating diffusion node FD in the HCG mode may be higher than a voltage of the floating diffusion node FD in the LCG mode. Components of the pixel PX and operation of the pixel PX in the conversion gain mode will be described later in detail with reference to FIG. 2.

In first image data generated as the plurality of pixels PX of the pixel array 110 operate in the HCG mode, a dark region may be clearly expressed, and in second image data generated as the plurality of pixels PX of the pixel array 110 operate in the LCG mode, a bright region may be clearly expressed.

In some example embodiments, in one frame in which the pixel array 110 is scanned, each of the plurality of pixels PX may continuously operate in the HCG mode and the LCG mode in a corresponding read period, so that the first image data and the second image data may be generated in one frame period. The first image and the second image may be merged to generate a one-shot image with a high dynamic range in which a bright region (a high illuminance region) and a dark region (a low illuminance region) are clearly implemented. As such, the DCG in one frame may be referred to as an intra-scene DCG.

The row driver 120 drives the pixel array 110 in units of rows. The row driver 120 may decode a row control signal (for example, an address signal) received from the timing controller 190 and may select at least one row line from row lines constituting the pixel array 110 in response to the decoded row control signal. For example, the row driver 120 may generate a selection signal for selecting one of a plurality of rows. The pixel array 110 may output a pixel signal, for example, a pixel voltage from a row selected by the selection signal provided by the row driver 120. The pixel signal may include a reset signal and the image signal. The row driver 120 may transmit control signals for outputting the pixel signal to the pixel array 110, and the pixel PX may operate in response to the control signals to output the pixel signal.

The ramp signal generator 130 may generate a ramp signal RAMP (for example, a ramp voltage) of which level rises or falls at a predetermined (or, alternatively, desired or determined) slope under the control of the timing controller 190. In order to determine a digital value corresponding to a digital pixel signal, it is necessary to determine intensity of a generated current. In order to determine the intensity of the generated current, a reference signal compared with the generated current is required. The reference signal may include the ramp signal RAMP. By comparing the intensity of the generated current with the intensity of the ramp signal RAMP, a section to which the intensity of the generated current belongs is determined. The ramp signal RAMP may be provided to each of a plurality of correlated double sampling (CDS) circuits 160 provided in the ADC circuit 150.

The ramp signal generator 130 according to the inventive concepts may include a ramp clock control circuit capable of adjusting a clock of the ramp signal to change an analog gain of the ramp signal (for example, a slope gain of the ramp signal) in the conversion gain mode, and a ramp offset control circuit capable of adjusting an offset value of the ramp signal. In the ramp signal generator 130 according to the inventive concepts, although the analog gain is changed, the ramp signal may have the same auto-zero level without a change in current/voltage of the ramp signal, so that the ramp signal may be read out when the analog gain is changed within 1H-time. The 1H-time may mean a time taken for the row driver 120 to scan one row.

The counting code generator 140 may generate a counting code CCD under the control of the timing controller 190. The counting code CCD may be provided to each of a plurality of counter circuits 170. In some example embodiments, the counting code generator 140 may be implemented as a gray code generator. The counting code generator 140 may generate a plurality of code values having a resolution according to the set number of bits as the counting code CCD. For example, when a 10-bit code is set, the counting code generator 140 may generate the counting code CCD including 1,024 code values that sequentially increase or decrease.

The ADC circuit 150 may include the plurality of CDS circuits 160 and the plurality of counter circuits 170. The ADC circuit 150 may convert the pixel signal (for example, the pixel voltage) input from the pixel array 110 into a pixel value that is a digital signal. Each pixel signal received through each of the plurality of column lines CL may be converted into the pixel value that is the digital signal, by each of the plurality of CDS circuits 160 and each of the plurality of counter circuits 170.

The CDS circuit 160 may compare the pixel signal, for example, the pixel voltage received through the column line CL with the ramp signal RAMP, and may output the comparison result as a comparison result signal. When a level of the ramp signal RAMP is the same as a level of the pixel signal, the CDS circuit 160 may output a comparison signal that transitions from a first level (for example, logic high) to a second level (for example, logic low). A time point at which a level of the comparison signal transitions may be determined by the level of the pixel signal.

The CDS circuit 160 may sample the pixel signal provided by the pixel PX by a CDS method. The CDS circuit 160 may sample the reset signal received as the pixel signal and may compare the reset signal with the ramp signal RAMP to generate the comparison signal according to the reset signal. Then, the CDS circuit 160 may sample the image signal correlated with the reset signal and may compare the image signal with the ramp signal RAMP to generate the comparison signal according to the image signal.

The counter circuit 170 may count a level transition time point of the comparison result signal output from the CDS circuit 160 and may output a count value. In some example embodiments, the counter circuit 170 may include a latch circuit and an operation circuit. The latch circuit may receive the counting code CCD from the counting code generator 140 and the comparison signal from the CDS circuit 160 and may latch a value of the counting code CCD at a time point at which the level of the comparison signal transitions. The latch circuit may latch a code value corresponding to the reset signal, for example, a reset value and a code value corresponding to the image signal, for example, an image signal value. The operation circuit may operate the reset value and the image signal value to generate the image signal value from which a reset level of the pixel PX is removed. The counter circuit 170 may output the image signal value from which the reset level is removed as the pixel value.

The data output circuit 180 may temporarily store and output the pixel value output from the ADC circuit 150. The data output circuit 180 may include a plurality of column memories 181 and a column decoder 182. The column memory 181 stores the pixel value received from the counter circuit 170. In some example embodiments, the plurality of column memories 181 may be provided in the plurality of counter circuits 170, respectively. The plurality of pixel values stored in the plurality of column memories 181 may be output as image data IDT under control of the column decoder 182.

The timing controller 190 may output a control signal to each of the row driver 120, the ramp signal generator 130, the counting code generator 140, the ADC circuit 150, and the data output circuit 180 to control operation or timing of each of the row driver 120, the ramp signal generator 130, the counting code generator 140, the ADC circuit 150, and the data output circuit 180.

A processor 1200 connected to the image sensor 100 may perform noise reduction processing, gain adjustment, waveform shaping processing, interpolation processing, white balance processing, gamma processing, edge enhancement processing, and/or binning on image data. In some example embodiments, the processor 1200 may be provided in the image sensor 100.

The image sensor 100 according to the inventive concepts may convert incident light into the image signal. The image sensor 100 according to the inventive concepts may be included in an electronic device (not shown). According to some example embodiments, the electronic device including the image sensor 100 according to the inventive concepts may have an image or light sensing function. For example, the electronic device may include any one of a camera, a smartphone, a wearable device, the Internet of things (IoT), a tablet personal computer (PC), a personal digital assistant (PDA), a portable multimedia player (PMP), and a navigation device. For example, the electronic device may be provided as a part a vehicle, furniture, a manufacturing facility, a door, and various measuring devices.

Figure 2:
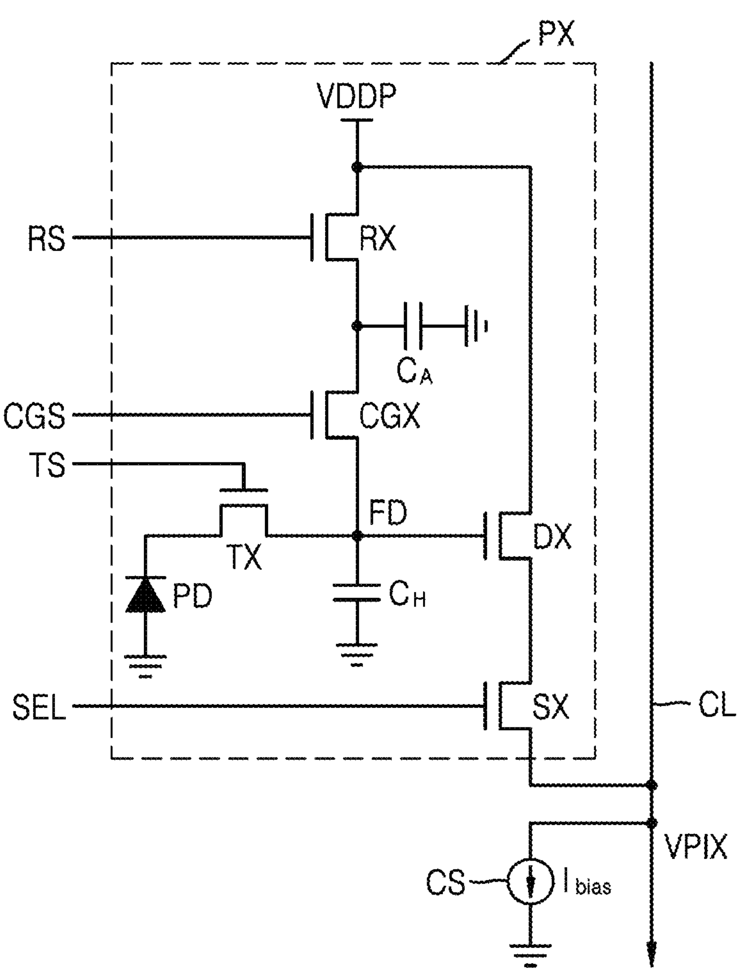
FIG. 2 is a circuit diagram illustrating one implementation of a pixel according to some example embodiments.

FIG. 2 is a circuit diagram illustrating one implementation of a pixel PX according to some example embodiments.

The pixel PX according to some example embodiments may include a photodiode PD, a plurality of transistors, for example, a transmission transistor TX, a reset transistor RX, a driving transistor DX, a selection transistor SX, and a gain control transistor CGX (or referred to as a conversion gain control transistor), and a capacitor $C_A$. A capacitor $C_H$, for example, a parasitic capacitor, may be formed by the floating diffusion node FD. The capacitor $C_A$ may include a passive element having a fixed or variable capacitance, a parasitic capacitor formed by a source/drain of the gain control transistor CGX, or a parasitic capacitor formed in another pixel PX that may be connected to the source/drain of the gain control transistor CGX.

The photodiode PD may convert light incident from the outside into an electrical signal. The photodiode PD generates an electric charge according to intensity of the light. An amount of the charge generated by the photodiode PD varies according to an image capturing environment (low or high illuminance). For example, the amount of charge generated by the photodiode PD may reach full well capacity (FWC) of the photodiode PD in a high-illuminance environment, but may not reach the FWC of the photodiode PD in a low-illuminance environment.

The transmission transistor TX, the reset transistor RX, the driving transistor DX, the selection transistor SX, and the gain control transistor CGX may operate in response to control signals provided by the row driver 120, for example, a reset control signal RS, a transmission control signal TS, a selection signal SEL, and a gain control signal CGS, respectively.

The reset transistor RX may be turned on in response to a reset control signal RS applied to a gate terminal thereof to reset the floating diffusion node FD based on a pixel power voltage VDDP. At this time, the gain control transistor CGX is also turned on based on the gain control signal CGS received by a gate terminal thereof, so that the pixel power voltage VDDP may be applied to the floating diffusion node FD to reset the floating diffusion node FD.

The transmission transistor TX may be turned on in response to the transmission control signal TS applied to a gate terminal thereof to transmit the charge generated by the photodiode PD to the floating diffusion node FD. Accordingly, the charge may be accumulated in the floating diffusion node FD. In other words, when the charge is accumulated in the capacitor $C_H$ formed by the floating diffusion node FD or the gain control transistor CGX is turned on, the charge may be accumulated in the capacitor $C_H$ and the capacitor $C_A$.

The charge accumulated in the floating diffusion node FD may generate a voltage. In other words, the charge accumulated in the floating diffusion node FD may be converted into a voltage. The conversion gain is determined by the capacitance of the floating diffusion node FD, and may be inversely proportional to a magnitude of the capacitance. A unit of the conversion gain may be, for example, uV/e. When the capacitance of the floating diffusion node FD increases, the conversion gain decreases, and when the capacitance decreases, the conversion gain increases.

The driving transistor DX may operate as a source follower based on a bias current Ibias generated by a current source CS connected to the column line CL, and may output a voltage corresponding to the voltage of the floating diffusion node FD as a pixel voltage VPIX through the selection transistor SX.

The selection transistor SX may select the pixel PX. The selection transistor SX may be turned on in response to the selection signal SEL applied to a gate terminal thereof to output the pixel voltage VPIX (or a current) output from the driving transistor DX to the column line CL. The pixel voltage VPIX may be provided to the ADC circuit 150 (refer to FIG. 1) through the column line CL.

The gain control transistor CGX may be turned on or off based on the gain control signal CGS received by the gate terminal thereof. When the gain control transistor CGX is turned off, the floating diffusion node FD has capacitance by the capacitor $C_H$. When the gain control transistor CGX is turned on, the capacitor $C_A$ is connected to the floating diffusion node FD and the floating diffusion node FD has capaciance by the capacitor $C_H$ and a capacitor $C_A$. Therefore, the capacitance of the floating diffusion node FD increases. The conversion gain when the gain control transistor CGX is turned off may be higher than the conversion gain when the gain control transistor CGX is turned on. When the gain control transistor CGX is turned off, it may be referred to as an HCG mode, and when the gain control transistor CGX is turned on, it may be referred to as an LCG mode.

As such, the pixel PX may operate in one of the HCG mode and the LCG mode according to the turn-on and turn-off of the gain control transistor CGX. In the HCG mode, because the conversion gain of the pixel PX may increase, gains of circuits (for example, the ADC circuit 150) for processing the pixel voltage VPIX output from the pixel PX may decrease. Therefore, a signal to noise ratio (SNR) of the image sensor 100 (refer to FIG. 1) may increase so that the minimum detectable amount of light may decrease, and performance of the image sensor 100 for detecting a low amount of light may improve. In the LCG mode, because the capacitance of the floating diffusion node FD of the pixel PX is large, the FWC may increase. Therefore, performance of the image sensor 100 for detecting a high amount of light may improve.

As such, because the pixel PX provides the DCG to sense a low amount of light and a high amount of light, a dynamic range of the image sensor 100 may increase. According to an example, the analog gain applied in the HCG mode or the LCG mode may vary. According to an example, the ramp signal generator 130, which will be described later, may adjust clock and offset values of the ramp signal to equally control auto-zero levels of ramp signals having different analog gains applied in the HCG mode or the LCG mode. For example, according to some example embodiments, there may be an increase in accuracy of image production and operation of the device based on the above methods. Therefore, the improved devices and methods overcome the deficiencies of the conventional devices and methods to image capturing related to ramp signals while reducing resource consumption and increasing data clarity. For example, by using the disclosed clock divider and ramp clocks, an offset value may be more accurate while requiring fewer resources, such as memory access and/or power to drive circuitry to produce an improved image.

Figure 3:
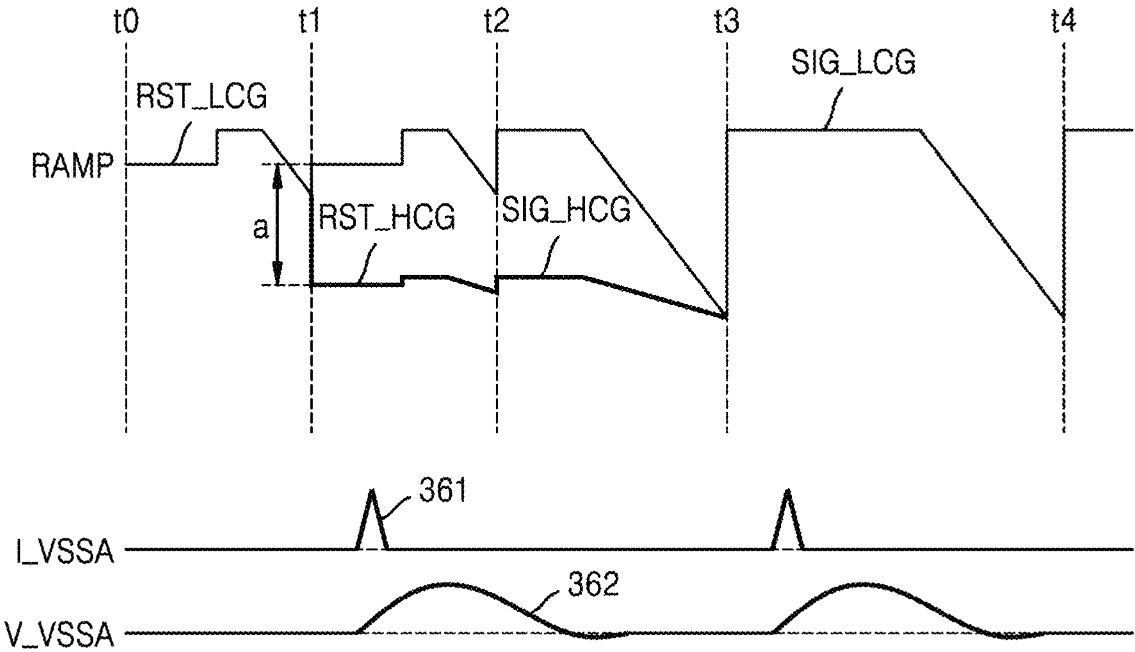
FIG. 3 is a timing diagram illustrating a voltage fluctuation due to an auto-zero level difference in a dual conversion gain (DCG) mode of a pixel according to some example embodiments.

FIG. 3 is a timing diagram illustrating a voltage fluctuation due to an auto-zero level difference in a DCG mode of a pixel according to some example embodiments.

FIG. 3 is a timing diagram within 1H-time in which different analog gains are set by using a dual ramp in the ramp signal generator according to a comparative embodiment, and it is assumed that the 1H-time includes a period from t0 to t4.

Referring to FIG. 3, a period from t0 to t1 represents a read-out section of the reset signal in the LCG mode, a period from t2 to t3 represents a read-out section of the image signal in the HCG mode, and a period from t3 to t4 represents a read-out section of the image signal in the LCG mode. At this time, it is assumed that the analog gain in the HCG mode is four times that of the analog gain in the LCG mode, and accordingly, a difference between an auto-zero level of a ramp reset signal RST_HCG in the HCG mode and an auto-zero level of a ramp reset signal RST_LCG in the LCG mode is 'a'.

When transition from the LCG mode to the HCG mode is made at a point in time t1, an internal voltage of the ramp signal generator instantaneously decreases from the auto-zero level of the ramp reset signal RST_LCG in the LCG mode to the auto-zero level of the ramp reset signal RST_HCG in the HCG mode by 'a' so that a fluctuation 361 in current I_VSSA in the ramp signal generator and/or a fluctuation 362 in voltage V_VSSA in the ramp signal generator are/is caused to affect the ramp signal and to generate a code error during digital conversion of pixel value data.

The ramp signal generator according to some example embodiments may maintain the same auto-zero level between the ramp signals having different gains by adjusting the clock and offset values of the ramp signal according to the conversion gain mode to change the analog gain, which will be described in detail with reference to FIGS. 4 to 11.

Figure 4:
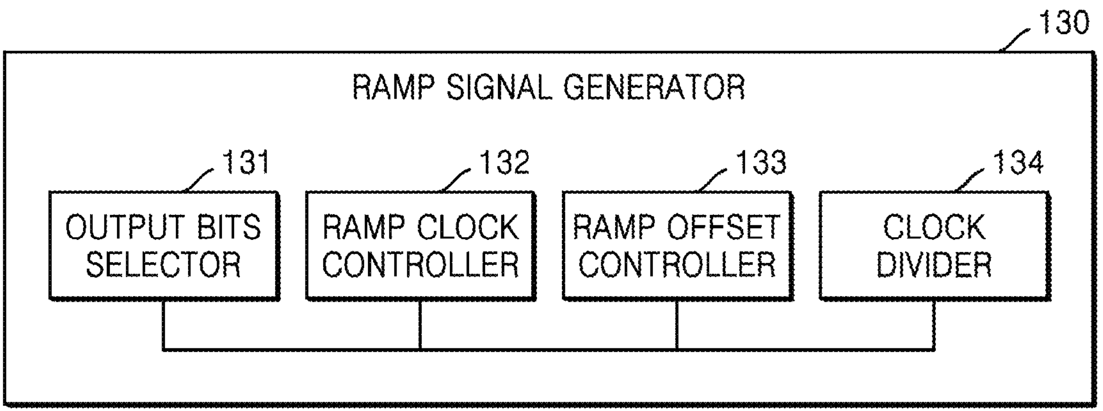
FIG. 4 is a block diagram schematically illustrating a configuration of a ramp signal generator according to some example embodiments.

FIG. 4 is a block diagram schematically illustrating a configuration of a ramp signal generator 130 according to some example embodiments. The ramp signal generator of FIG. 4 may correspond to the ramp signal generator 130 of FIG. 1.

Referring to FIG. 4, the ramp signal generator 130 may include an output bit selector 131, a ramp clock controller 132, a ramp offset controller 133, and a clock divider 134.

The output bit selector 131 may select an output bit of a code value (or code value data) for reading out an image signal of a pixel based on an analog gain of a ramp signal for implementing a target resolution of a display panel (not shown). The analog gain of the ramp signal, that is, a slope gain of the ramp signal, may be determined based on a preset (or, alternatively, generated or desired) display resolution of a device. For example, when high dynamic range (HDR) extension is required to display image data at a first resolution on the display panel, the ramp signal generator 130 may divide the clock of the ramp signal to generate a ramp signal having an analog gain 'n*A' obtained by multiplying the analog gain of the ramp signal (for example, the slope gain of the ramp signal) 'A' by n. That is, the ramp signal generator 130 may divide the clock of the ramp signal to generate a ramp signal having a slope gain 'n*A' from the ramp signal having the slope gain 'A'. The output bit selector 131 may select the output bit of the code value of the image signal as (P+2) bits based on the analog gain of the ramp signal (for example, the slope gain of the ramp signal) 'n*A'. In some example embodiments, when HDR extension is required to display image data at a second resolution on the display panel, the ramp signal generator 130 may divide the clock of the ramp signal to generate a ramp signal having an analog gain 'm*A' obtained by multiplying the analog gain of the ramp signal (for example, the slope gain of the ramp signal) 'A' by m. That is, the ramp signal generator 130 may divide the clock of the ramp signal to generate a ramp signal having a slope gain 'm*A' from the ramp signal having the slope gain 'A'. The output bit selector 131 may select the output bit of the code value data as (P+3) bits based on the analog gain of the ramp signal (for example, the slope gain of the ramp signal) 'm*A'. The output bit selector 131 may transmit information on the selected output bit to the ramp clock controller 132, the ramp offset controller 133, and the clock divider 134. A detailed description of the structure of the output bit selector 131 according to some example embodiments will be given later with reference to FIG. 5A.

The ramp clock controller 132 may set the clock of the ramp signal to correspond to the output bit selected by the output bit selector 131. The clock may be mapped to the output bit corresponding thereto and stored in internal/external memory of the ramp signal generator 130. For example, when the output bit selector 131 selects the output bit of the code value as the '(P+2) bits' according to the first resolution (or the slope gain 'n*A' of the ramp signal), the ramp clock controller 132 may set a clock 'CLK/n' obtained by multiplying a basic clock (for example, a counter clock) 'CLK' by '1/n' as the clock of the ramp signal. For example, when the output bit selector 131 selects the output bit of the code value as the '(P+3) bits' according to the second resolution (or the slope gain 'm*A' of the ramp signal), the ramp clock controller 132 may set a clock 'CLK/m' obtained by multiplying the basic clock (for example, the counter clock) 'CLK' by '1/m' as the clock of the ramp signal. A detailed description of the structure of the ramp clock controller 132 according to some example embodiments will be given later with reference to FIG. 5B.

The ramp offset controller 133 may set an offset value of the ramp signal to correspond to the output bit selected by the output bit selector 131. The offset value may be mapped to the output bit corresponding thereto and stored in the internal/external memory of the ramp signal generator 130. For example, when the output bit selector 131 selects the output bit of the code value as the '(P+2) bits' according to the first resolution (or the slope gain 'n*A' of the ramp signal), the ramp clock controller 133 may set an offset value 'X/n' obtained by multiplying a basic offset value 'X' by '1/n' as the offset value of the ramp signal. In some example embodiments, when the output bit selector 131 selects the output bit of the code value as the '(P+3) bits' according to the second resolution (or the slope gain 'm*A' of the ramp signal), the ramp clock controller 133 may set an offset value 'X/m' obtained by multiplying the basic offset value 'X' by '1/m' as the offset value of the ramp signal. A detailed description of the structure of the ramp offset controller 133 according to some example embodiments will be given later with reference to FIG. 5C.

The clock divider 134 may generate the clock of the ramp signal of the ramp signal generator 130 in the DCG mode. For example, the clock divider 134 may generate a plurality of clocks by dividing the basic clock, that is, the counter clock, according to the analog gain of the ramp signal (for example, the slope gain of the ramp signal). A detailed description of the structure of the clock divider 134 according to some example embodiments will be given later with reference to FIG. 5D.

According to some example embodiments, by controlling the ramp clock controller 132 and the ramp offset controller 133 based on the output bit according to the analog gain of the ramp signal (for example, the slope gain of the ramp signal) in the DCG mode, the auto-zero levels of the ramp signals having different analog gains, which are generated by the ramp signal generator 130, are equally set to reduce a settling time of the OTA of the image sensor and to prevent or reduce an abnormal voltage fluctuation from occurring between the ramp signal generator and the OTA.

FIGS. 5A to 5D are diagrams illustrating components included in the ramp signal generator 130 according to some example embodiments. The ramp signal generator 130 according to some example embodiments may include the components illustrated in FIGS. 5A to 5D that may be electrically connected to one another for data transmission and reception.

Figure 5A:
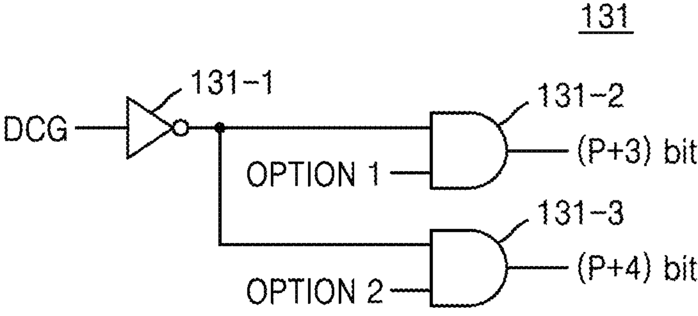
FIGS. 5A to 5D are diagrams illustrating components included in a ramp signal generator according to some example embodiments.

FIG. 5A is the diagram illustrating the structure of the output bit selector 131 of FIG. 4 according to some example embodiments. The output bit selector 131 may include an inverter 131-1, a first AND gate 131-2, and a second AND gate 131-3. The inverter 131-1 may invert an input dual conversion gain signal DCG and may output the inverted dual conversion gain signal DCG to the first AND gate 131-2 and the second AND gate 131-3. For example, in the LCG mode, the inverter 131-1 may output '0' obtained by inverting the input dual conversion gain signal DCG '1' to the first AND gate 131-2 and the second AND gate 131-3. In some example embodiments, in the HCG mode, the inverter 131-1 may output '1' obtained by inverting the input dual conversion gain signal DCG '0' to the first AND gate 131-2 and the second AND gate 131-3.

The first AND gate 131-2 may receive the inverted dual conversion gain signal DCG and a first option signal OPTION1 as inputs and may output information on an output bit of an image signal. The second AND gate 131-3 may receive the inverted dual conversion gain signal DCG and a second option signal OPTION2 as inputs and may output information on an output bit of an image signal. The first AND gate 131-2 and the second AND gate 131-3 may select an output bit according to an analog gain (for example, a slope gain) in a preset (or, alternatively, generated or desired) conversion gain mode based on the first option signal OPTION1 and the second option signal OPTION2. The first option signal OPTION1 and the second option signal OPTION2 as one-bit signals may be determined according to the analog gain in the HCG mode (hereinafter, it is assumed that the analog gain is 'A' in the LCG mode). For example, when the analog gain in the HCG mode is '2*A', the output bit '(P+3) bits' may be selected as the first option signal OPTION1 of '1' and the second option signal OPTION2 of '0' are input to the first AND gate 131-2 and the second AND gate 131-3, respectively. In some example embodiments, when the analog gain in the HCG mode is '4*A', the output bit '(P+4) bits' may be selected as the first option signal OPTION1 of '0' and the second option signal OPTION2 of '1' are input to the first AND gate 131-2 and the second AND gate 131-3, respectively. Although not shown in FIG. 5A, in some example embodiments, the output bit '(P+2) bits' may be selected as the first option signal OPTION1 of '0' and the second option signal OPTION2 of '0' are input to the first AND gate 131-2 and the second AND gate 131-3, respectively. The output bit selector 131 may transmit information on the selected output bit to the ramp clock controller 132, the ramp offset controller 133, and the clock divider 134.

Figure 5B:
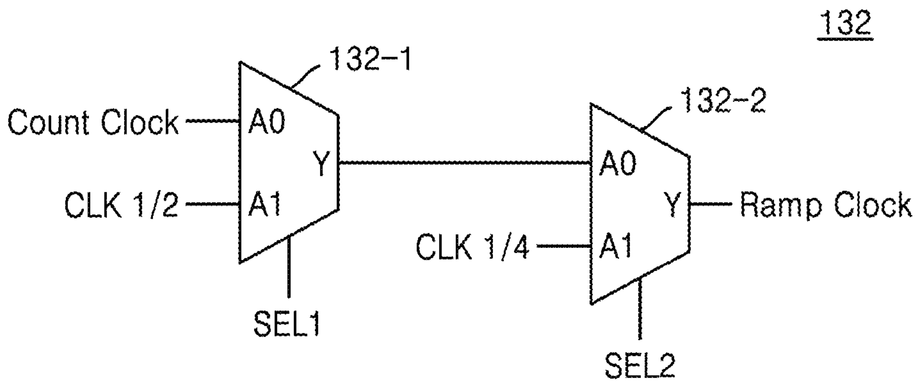

FIG. 5B is the diagram illustrating the structure of the ramp clock controller 132 of FIG. 4 according to some example embodiments. The ramp clock controller 132 may include a first multiplexer 132-1 and a second multiplexer 132-2, and the first multiplexer 132-1 and the second multiplexer 132-2 may be electrically connected to each other. In FIG. 5B, a count clock Count Clock refers to a basic clock, and it is assumed that a first clock CLK1/2 is obtained by dividing the count clock Count Clock by ½ when the analog gain in the HCG mode is 'twice' the analog gain in the LCG mode and a second clock CLK1/4 is obtained by dividing the count clock Count Clock by ¼ when the analog gain in the HCG mode is '4 times' the analog gain in the LCG mode.

The first multiplexer 132-1 may select one of the count clock Count Clock and the first clock CLK1/2 based on the output bit selected by the output bit selector 131 and may output the selected one to the second multiplexer 132-2. The second multiplexer 132-2 may determine one of the clock output from the first multiplexer 132-1 and the second clock CLK1/4 as the clock of the ramp signal based on the output bit selected by the output bit selector 131. For example, when the selected output bit is '(P+3) bits' (that is, when the analog gain is in the HCG mode is '2', for example, preset in the HCG mode), a first selection signal SEL1 '1' is input to the first multiplexer 132-1, and a second selection signal SEL2 '0' is input to the second multiplexer 132-2 so that the first clock CLK1/2 may be output from the second multiplexer 132-2. In some example embodiments, when the selected output bit is '(P+4) bits' (that is, when the analog gain is in the HCG mode is '4', for example, preset in the HCG mode), a first selection signal SEL1 '0' is input to the first multiplexer 132-1, and a second selection signal SEL2 '1' is input to the second multiplexer 132-2 so that the second clock CLK1/4 may be output from the second multiplexer 132-2. The ramp clock controller 132 may set the clock output from the second multiplexer 132-2 as the clock of the ramp signal in the HCG mode.

Figure 5C:
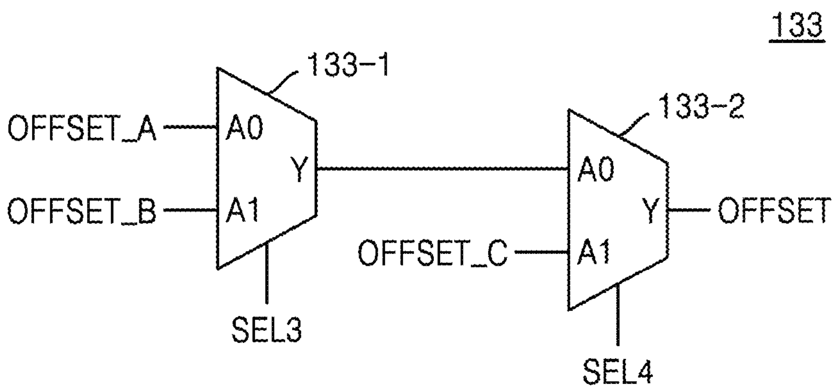

FIG. 5C is the diagram illustrating the structure of the ramp offset controller 133 of FIG. 4 according to some example embodiments. The ramp offset controller 133 may include a third multiplexer 133-1 and a fourth multiplexer 133-2, and the third multiplexer 133-1 and the fourth multiplexer 133-2 may be electrically connected to each other. In FIG. 5C, in the DCG mode, it is assumed that a first offset OFFSET_A is a default offset value when the analog gain of the ramp signal (for example, the slope gain of the ramp signal) is "1", a second offset OFFSET_B is an offset value when the analog gain of the ramp signal is '2', and a third offset OFFSET_C is an offset value when the analog gain of the ramp signal is '4'.

The third multiplexer 133-1 may select one of the first offset OFFSET_A and the second offset OFFSET_B based on the output bit selected by the output bit selector 131 and may output the selected one to the fourth multiplexer 133-2. The fourth multiplexer 133-2 may determine one of the clock output from the third multiplexer 133-1 and the third offset OFFSET_C as the offset value of the ramp signal in the HCG mode based on the output bit selected by the output bit selector 131. For example, when the selected output bit is '(P+3) bits' (that is, when the analog gain is in the HCG mode is '2', for example, preset in the HCG mode), a third selection signal SEL3 '1' is input to the third multiplexer 133-1, and a fourth selection signal SEL4 '0' is input to the fourth multiplexer 133-2 so that the second offset OFFSET_B may be output from the fourth multiplexer 133-2. In some example embodiments, when the selected output bit is '(P+4) bits' (that is, when the analog gain in the HCG mode is '4', for example, preset in the HCG mode), a third selection signal SEL3 '0' is input to the third multiplexer 133-1, and a fourth selection signal SEL4 '1' is input to the fourth multiplexer 133-2 so that the third offset OFFSET_C may be output from the fourth multiplexer 133-2. The ramp offset controller 133 may set the offset output from the fourth multiplexer 133-2 as the offset value of the ramp signal in the HCG mode.

Figure 5D:
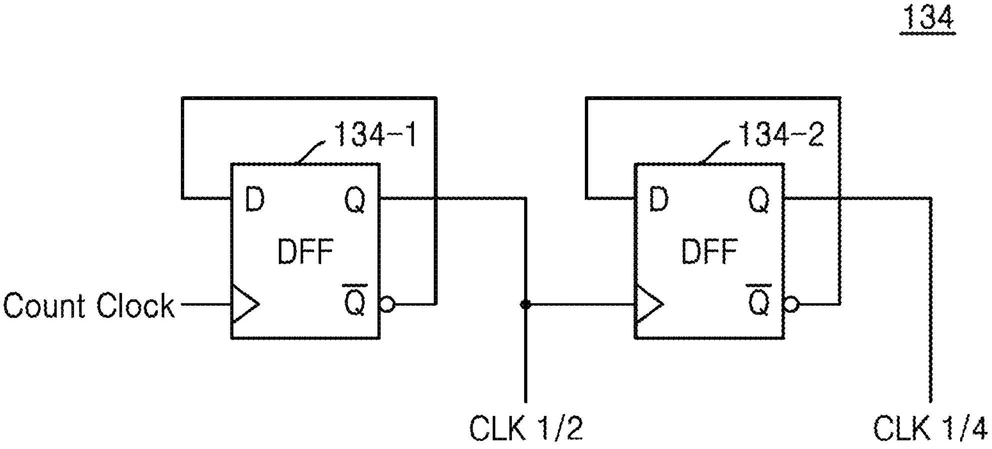

FIG. 5D is the diagram illustrating the structure of the clock divider 134 of FIG. 4 according to some example embodiments.

The clock divider 134 may include a first D flip-flop 134-1 and a second D flip-flop 134-2. The first D flip-flop 134-1 may divide the count clock Count Clock as the basic clock by ½ to generate the first clock CLK1/2, and the second D flip-flop 134-2 may divide the count clock Count Clock as the basic clock by ¼ to generate the second clock CLK1/4.

For example, in HCG mode, when the output bit selected by the output bit selector 131 is '(P+3) bits' according to the analog gain of '2', the first clock CLK1/2 generated by the clock divider 134 may be used as the clock of the ramp signal. In some example embodiments, in HCG mode, when the output bit selected by the output bit selector 131 is '(P+4) bits' according to the analog gain of '4', the second clock CLK1/4 generated by the clock divider 134 may be used as the clock of the ramp signal.

FIG. 6 is a diagram illustrating an example of an output according to an input applied to a ramp signal generator according to some example embodiments.

Referring to FIG. 6, a signal input to the ramp signal generator 130 (for example, the output bit selector 131 of FIG. 5A) includes a dual conversion gain signal DCG, a first option signal OPTION1, and a second option signal OPTION2 and the ramp signal output from the ramp signal generator 130 in response to the input signal may include an analog gain, a ramp signal clock RAMP CLK, and an offset OFFSET. In FIG. 6, it is assumed that the output bit in the LCG mode is P bits, and the output bit in the HCG mode is (P+2) bits, (P+3) bits, or (P+4) bits according to the analog gain.

As the input signal, in which the dual conversion gain signal DCG is '1', the first option signal OPTION1 is '0', and the second option signal OPTION2 is '0' when the output bit in the LCG mode is P bits, is applied to the output bit selector 131 of FIG. 5A, the analog gain may be 'A', the ramp signal clock RAMP CLK may be the basic clock 'CLK', and the offset value of the ramp signal may be 'X' in the LCG mode.

As the input signal, in which the dual conversion gain signal DCG is '0', the first option signal OPTION1 is '0', and the second option signal OPTION2 is '0' when the output bit in the HCG mode is (P+2) bits, is applied to the output bit selector 131 of FIG. 5A, the output bit of the image signal is selected as (P+2) bits and the ramp signal, in which the analog gain is 'A', the ramp signal clock RAMP CLK is the basic clock 'CLK', and the offset value of the ramp signal is 'X' in the HCG mode, may be output.

As the input signal, in which the dual conversion gain signal DCG is '0', the first option signal OPTION1 is '1', and the second option signal OPTION2 is '0' when the output bit in the HCG mode is (P+3) bits, is applied to the output bit selector 131 of FIG. 5A, the output bit of the image signal is selected as (P+3) bits and the ramp signal, in which the analog gain is 'A*2', the ramp signal clock RAMP CLK is 'CLK1/2' obtained by dividing the basic clock by ½, and the offset value of the ramp signal is 'X/2' in the HCG mode, may be output.

As the input signal, in which the dual conversion gain signal DCG is '0', the first option signal OPTION1 is '0', and the second option signal OPTION2 is '1' when the output bit in the HCG mode is (P+4) bits, is applied to the output bit selector 131 of FIG. 5A, the output bit of the image signal is selected as (P+4) bits and the ramp signal, in which the analog gain is 'A*4', the ramp signal clock RAMP CLK is 'CLK1/4' obtained by dividing the basic clock by ¼, and the offset value of the ramp signal is 'X/4' in the HCG mode, may be output.

An example of the ramp signal generated by the ramp signal generator in each HCG mode described above (for example, the HCG mode ((P+2) bits), the HCG mode ((P+3) bits), and the HCG mode ((P+4) bits)) will be described with reference to FIGS. 7 to 8.

In FIG. 6, only the ramp signal generation operation in which the analog gain of the ramp signal is 2 or 4 times in the HCG mode is described for convenience of description. However, the inventive concepts are not limited thereto, and the ramp signal generator 130 according to some example embodiments may generate a ramp signal with adjusted ramp clock and offset based on various analog gains.

In FIG. 6, it is assumed that the ramp signal has an offset value. However, the inventive concepts are not limited thereto, and the ramp signal generator 130 according to some example embodiments may adjust the ramp clock and the offset to generate a ramp signal having output bits of various number of bits.

Figure 7:
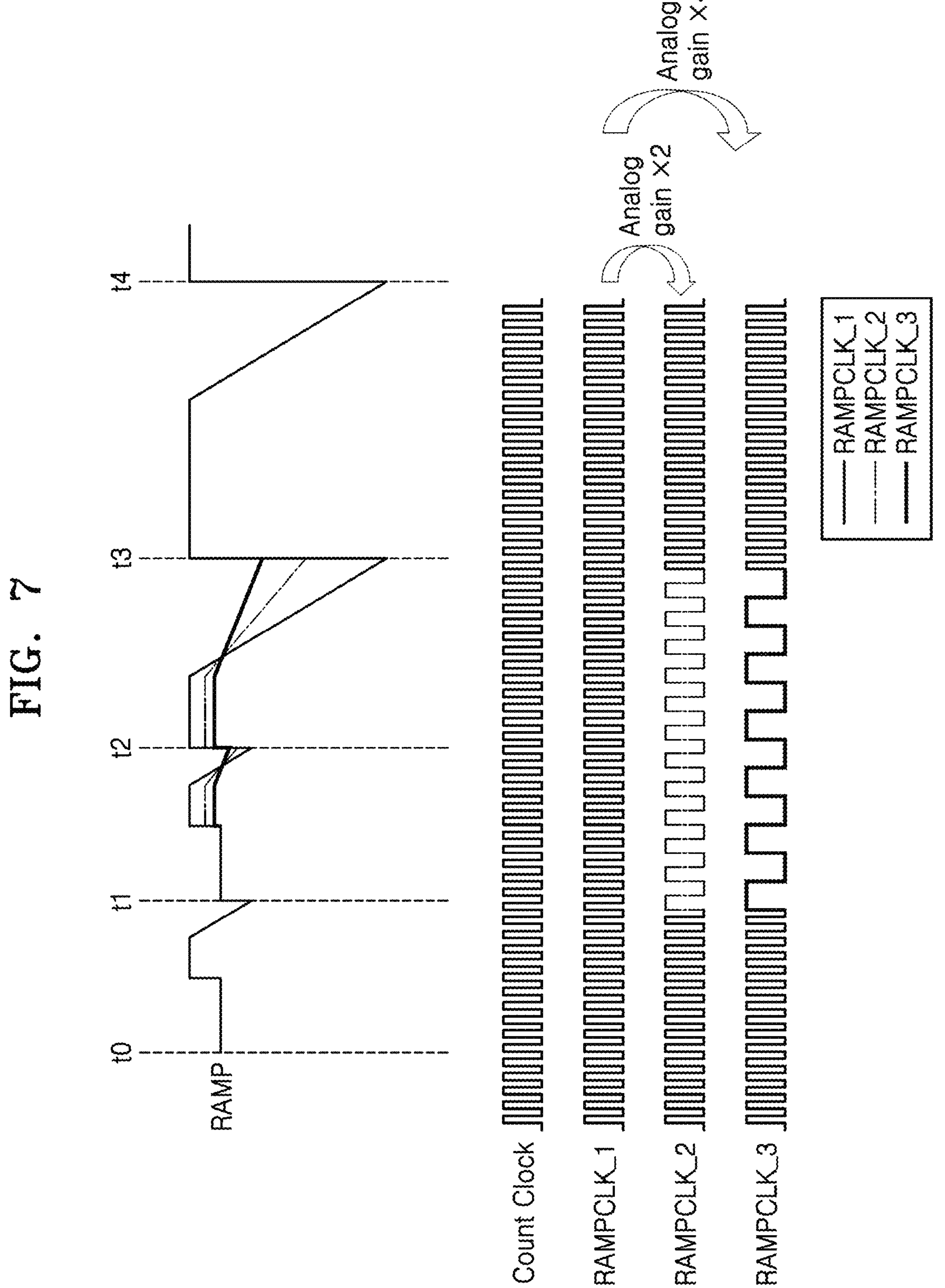
FIG. 7 is a diagram illustrating an operation of a ramp signal generator according to some example embodiments.

FIG. 7 is a diagram illustrating an operation of the ramp signal generator 130 according to some example embodiments.

In detail, FIG. 7 is a diagram illustrating an operation in which the ramp signal generator 130 changes the analog gain while maintaining the same auto-zero level between the ramp signals by adjusting the clock of the ramp signal.

Referring to FIG. 7, a period from t0 to t4 represents 1H-time, a period from t0 to t1 represents a read-out section of a reset signal in the LCG mode, a period from t1 to t2 represents a read-out section of a reset signal in the HCG mode, a period from t2 to t3 represents a read-out section of an image signal in the HCG mode, and a period from t3 to t4 represents a read-out section of an image signal in the LCG mode.

The ramp signal may have the same clock or different clocks according to the analog gain of the HCG mode. For example, when the analog gain in the HCG mode is one times the analog gain in the LCG mode, a ramp signal having a first ramp clock RAMPCLK_1 may be generated.

As the first ramp clock RAMPCLK_1 includes the same clock as the basic clock in the LCG mode and the analog gain in the HCG mode is one times the analog gain in the LCG mode, the first ramp clock RAMPCLK_1 may include the same clock as the basic clock in the HCG mode. In some example embodiments, when the analog gain in the HCG mode is twice the analog gain in the LCG mode, a ramp signal having a second ramp clock RAMPCLK_2 may be generated. As the second ramp clock RAMPCLK_2 includes the same clock as the basic clock in the LCG mode and the analog gain in the HCG mode is twice the analog gain in the LCG mode, the second ramp clock RAMPCLK_2 may include the clock obtained by dividing the basic clock by ½ in the HCG mode. In some example embodiments, when the analog gain in the HCG mode is four times the analog gain in the LCG mode, a ramp signal having a third ramp clock RAMPCLK_3 may be generated. As the third ramp clock RAMPCLK_3 includes the same clock as the basic clock in the LCG mode and the analog gain in the HCG mode is four times the analog gain in the LCG mode, the third ramp clock RAMPCLK_3 may include the clock obtained by dividing the basic clock by ¼ in the HCG mode.

In FIG. 7, only the ramp signal generation operation in which the analog gain of the ramp signal is 2 or 4 times in the HCG mode is described for convenience of description. However, the inventive concepts are not limited thereto, and the ramp signal generator 130 according to some example embodiments may generate a ramp signal with adjusted ramp clock and offset based on various analog gains.

The ramp signal generator 130 according to some example embodiments may operate in the conversion gain mode while maintaining the same auto-zero level between ramp signals having different gains by adjusting the clock and offset value (described later in FIG. 8) of the ramp signal in the HCG mode.

Figure 8:
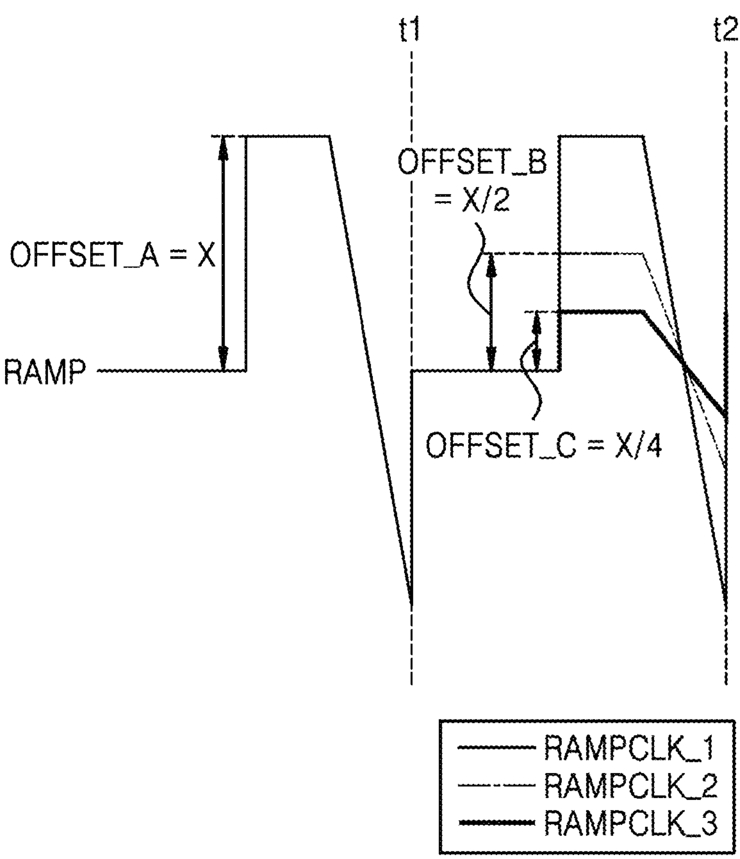
FIG. 8 is a diagram illustrating an operation of a ramp signal generator according to some example embodiments.

FIG. 8 is a diagram illustrating an operation of the ramp signal generator 130 according to some example embodiments.

In detail, FIG. 8 is a diagram illustrating an operation of the ramp signal generator 130 of changing the analog gain while maintaining the same auto-zero level in the conversion gain mode by adjusting offset values of ramp signals having different clocks. Description previously given with reference to FIG. 7 will not be given.

Referring to FIGS. 7 and 8, the ramp signal may have the same offset value or different offset values for each conversion gain mode according to the analog gain of the conversion gain mode. For example, when the analog gain in the HCG mode is one times the analog gain in the LCG mode, a ramp signal having the first ramp clock RAMPCLK_1 and a first offset value OFFSET_A in the HCG mode (the period from t1 to t3 in FIG. 7) may be generated. A size of the first offset value OFFSET_A may be 'X', which is the same size as the offset value in the LCG mode, as the analog gain in the HCG mode is one times the analog gain in the LCG mode. For example, when the analog gain in the HCG mode is twice the analog gain in the LCG mode, a ramp signal having the second ramp clock RAMPCLK_2 and a second offset value OFFSET_B in the HCG mode (the period from t1 to t3 in FIG. 7) may be generated. A size of the second offset value OFFSET_B may be 'X/2', which is ½ times the offset value in the LCG mode, as the analog gain in the HCG mode is twice the analog gain in the LCG mode. In some example embodiments, when the analog gain in the HCG mode is four times the analog gain in the LCG mode, a ramp signal having the third ramp clock RAMPCLK_3 and a third offset value OFFSET_C in the HCG mode (the period from t1 to t3 in FIG. 7) may be generated. A size of the third offset value OFFSET_C may be 'X/4', which is ¼ times the offset value in the LCG mode, as the analog gain in the HCG mode is four times the analog gain in the LCG mode.

In FIG. 8, only the ramp signal generation operation in which the analog gain of the ramp signal is 2 or 4 times in the LCG mode is described for convenience of description. However, the inventive concepts are not limited thereto, and the ramp signal generator 130 according to some example embodiments may generate a ramp signal with adjusted ramp clock and offset based on various analog gains.

Figure 9:
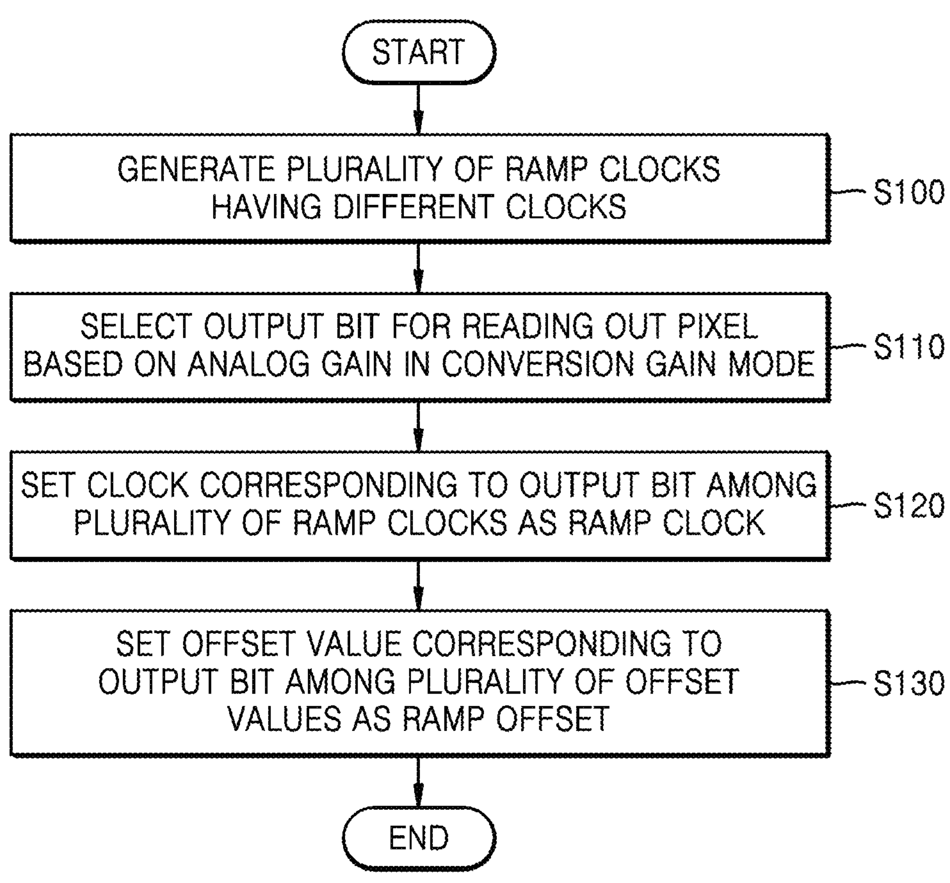
FIG. 9 is a flowchart illustrating an operating method of a ramp signal generator according to some example embodiments.

FIG. 9 is a flowchart illustrating a method of operating the ramp signal generator 130 according to some example embodiments.

In detail, FIG. 9 is a diagram illustrating the operation method in which the clock and/or offset of the ramp signal is adjusted by the ramp signal generator 130 to maintain the same auto-zero level between the ramp signals having different gains the same in the conversion gain mode and to extend the HDR. In FIG. 9, description previously given with reference to FIGS. 1 to 8 will not be given.

Referring to FIG. 9, the clock and/or offset of the ramp signal is adjusted by the ramp signal generator 130 to maintain the auto-zero level, and the operation method for HDR extension may include operations S100, S110, S120, and S130.

In the operation S100, the ramp signal generator 130 may generate a plurality of different ramp clocks. The ramp signal generator 130 may divide the count clock as the basic clock, to generate different ramp clocks.

In the operation S110, the ramp signal generator 130 may select the output bit for reading out the pixel based on the analog gain of the ramp signal (for example, the slope gain of the ramp signal) in the conversion gain mode (for example, the DCG mode). The output bit may refer to the output bit of the code value (or code value data) for reading out the image signal of the pixel based on the analog gain in the conversion gain mode. The analog gain of the ramp signal (for example, the slope gain of the ramp signal) in the conversion gain mode may be determined based on the preset (or, alternatively, generated or desired) display resolution of the device. For example, when the HDR extension is required to display the image data at the first resolution on the display panel, the ramp signal generator 130 may select the output bit of the code value of the image signal of the pixel as (P+2) bits based on the analog gain (that is, the slope gain) 'n*A' obtained by multiplying the analog gain 'A' of the ramp signal by n. The ramp signal generator 130 may select the output bit based on the circuit illustrated in FIG. 5A.

In the operation S120, the ramp signal generator 130 may set a clock corresponding to the output bit among the plurality of ramp clocks as a ramp clock. The ramp signal generator 130 may change the clock of the ramp signal to change the analog gain while maintaining the auto-zero level of the ramp signal (and additionally extending the HDR). For example, as illustrated in FIG. 7, when the analog gain of the ramp signal (for example, the slope gain of the ramp signal) in the HCG mode is 'twice' the analog gain of the ramp signal in the LCG mode, the first clock CLK1/2 obtained by dividing the count clock by ½ may be set as the clock of the ramp signal in the HCG mode, and when the analog gain of the ramp signal (for example, the slope gain of the ramp signal) in the HCG mode is 'four times' the analog gain of the ramp signal in the LCG mode, the second clock CLK1/4 obtained by dividing the count clock by ¼ may be set as the clock of the ramp signal in the HCG mode. The ramp signal generator 130 may select the output bit based on the circuit illustrated in FIGS. 5B and 5D.

In the operation S130, the ramp signal generator 130 may set an offset value corresponding to the output bit among the plurality of offset values as a ramp offset. The ramp signal generator 130 may change the offset value of the ramp signal to change the analog gain while maintaining the auto-zero level of the ramp signal (and additionally extending the HDR). For example, as illustrated in FIG. 8, when the analog gain of the ramp signal (for example, the slope gain of the ramp signal) in the HCG mode is 'twice' the analog gain of the ramp signal in the LCG mode, the second offset OFFSET_B obtained by multiplying the default offset value by ½ may be set as the offset value of the ramp signal in the HCG mode, and when the analog gain of the ramp signal (for example, the slope gain of the ramp signal) in the HCG mode is 'four times' the analog gain of the ramp signal in the LCG mode, the third offset OFFSET_C obtained by multiplying the default offset value by ¼ may be set as the offset value of the ramp signal in the HCG mode. The ramp signal generator 130 may select the output bit based on the circuit illustrated in FIG. 5C. Although not shown, the ramp signal generator 130 may output the output bit to read out the image signal of the pixel based on the ramp signal having the clock and offset values set in the operations S120 and S130.

The ramp signal generator 130 according to some example embodiments sets the clock and offset values of the ramp signal according to the analog gain of the ramp signal (for example, the slope gain of the ramp signal) to set the auto-zero levels of the ramp signals having different analog gains, which are output from the ramp signal generator 130, as the same auto zero level and to additionally extend the HDR by using the ramp signals having different analog gains.

In order to support fast read-out and HDR functions for high-performance image sensor design, it is expected that a mode in which the plurality of ramps are used at the same time will increase, for example, slowly or gradually increase. Although the image sensor according to some example embodiments implements a read-out mode by generating ramp signals having different analog gains by using one ramp signal generator, in order to support a fast read-out function based on more precise HDR characteristics, ramp signals having a plurality of analog gains, such as 1×, 2×, 4×, 8×, and 16×, may be implemented within one 1H-time or one frame.

According to the ramp signal generator of the inventive concepts, setting of the analog gain of the ramp signal (that is, the slope gain of the ramp signal) may be changed within 1H-time or one frame without a separate auto-zeroing settling time of a CDS OTA.

According to the ramp signal generator of the inventive concepts, a code value error occurring during read-out of the image signal may be minimized by stabilizing a reference voltage (for example, a GND voltage) of the ramp signal.

Figure 10:
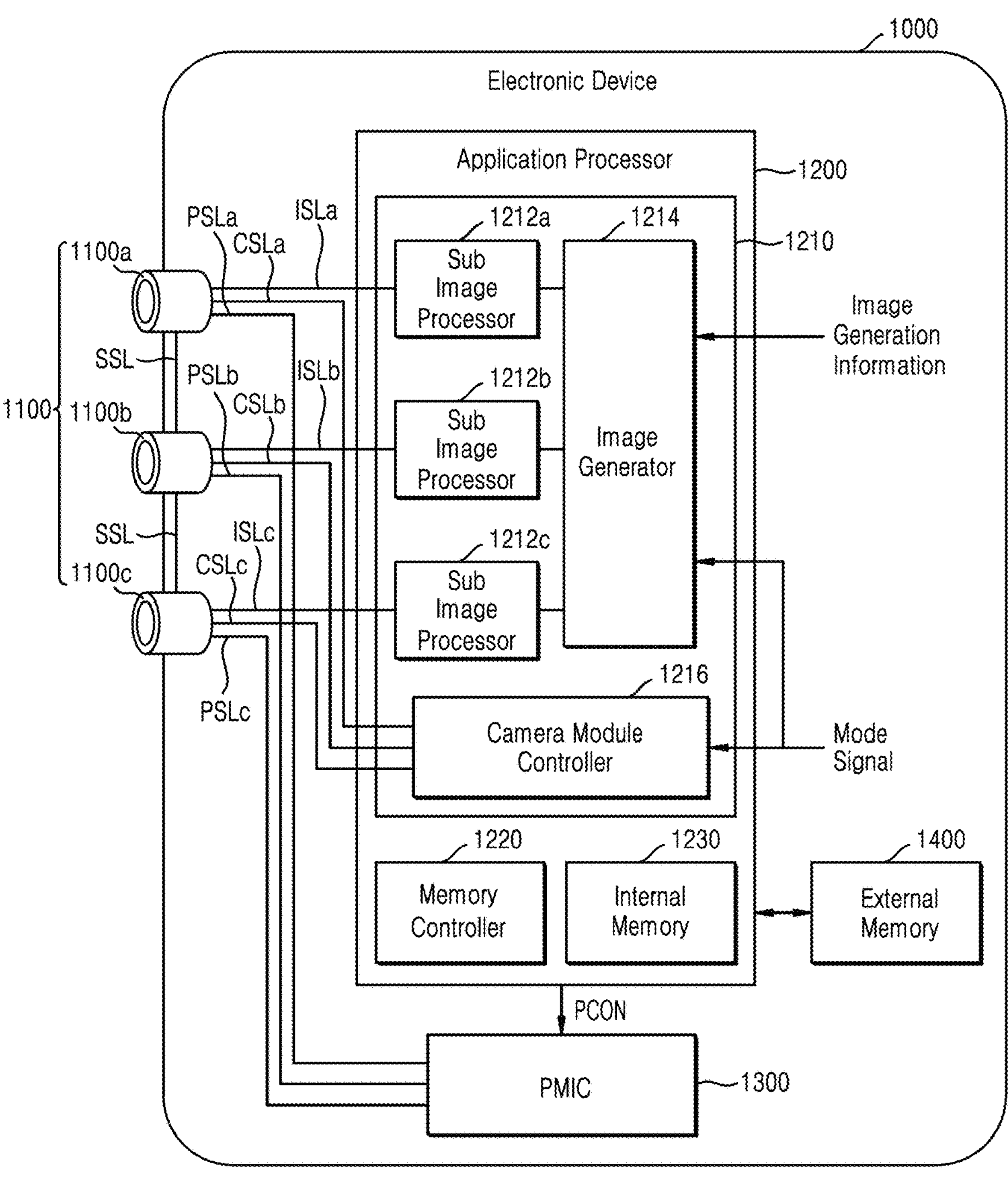
FIG. 10 is a block diagram of an electronic device including a multi-camera module.
Figure 11:
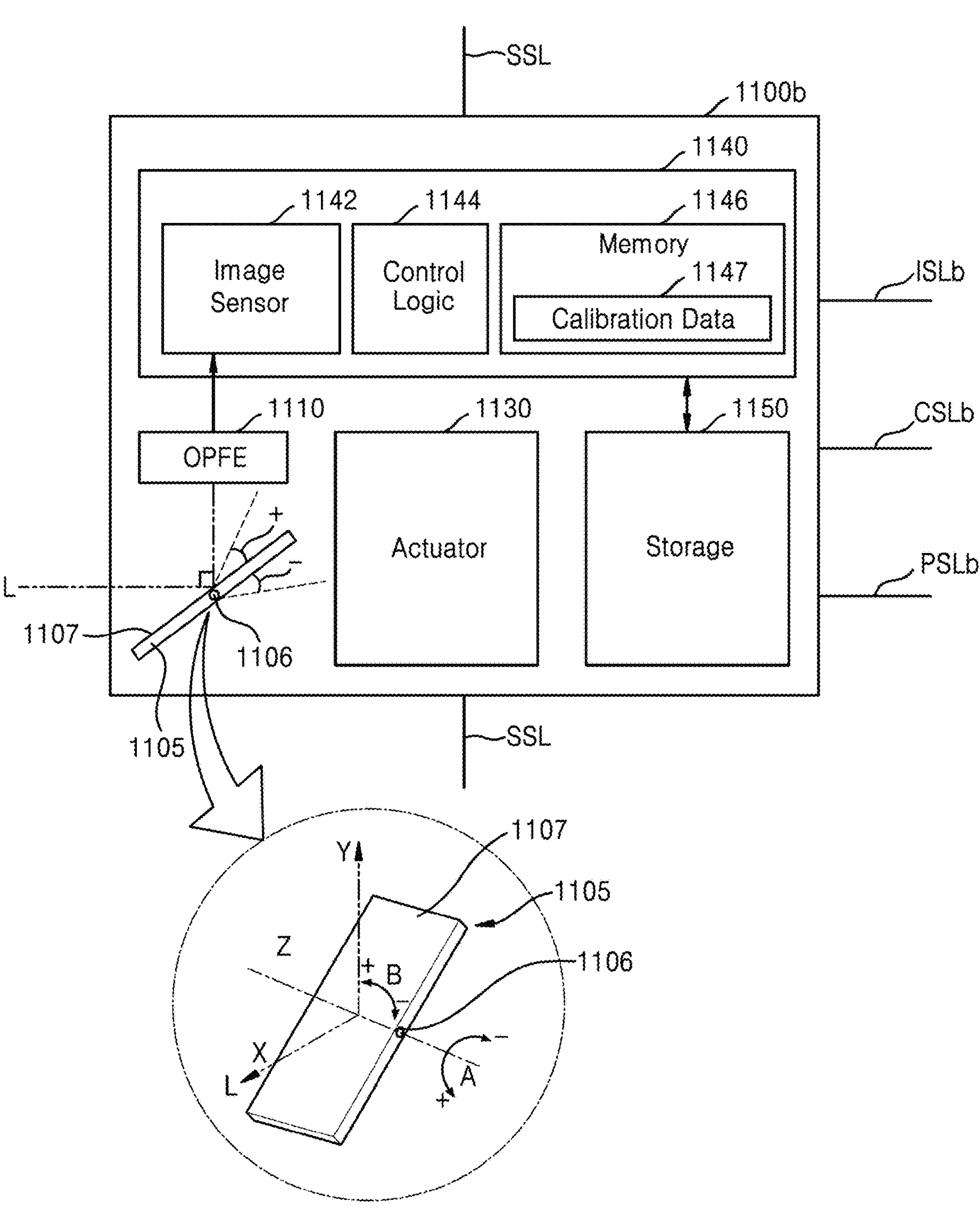
FIG. 11 is a detailed block diagram of the multi-camera module of FIG. 10.

FIG. 10 is a block diagram of an electronic device 1000 including a multi-camera module. FIG. 11 is a detailed block diagram of the camera module of FIG. 10. An image sensor 1142 of FIGS. 10 and 11 may correspond to the image sensor 100 of FIG. 1.

Referring to FIG. 10, the electronic device 1000 may include a camera module group 1100, an application processor 1200, a power module integrated circuit (PMIC) 1300, and external memory 1400.

The camera module group 1100 may include a plurality of camera modules 1100*a*, 1100*b*, and 1100*c*. Although it is illustrated in FIG. 10 that the three camera modules 1100*a*, 1100*b*, and 1100*c* are arranged, the inventive concepts are not limited thereto. In some example embodiments, the camera module group 1100 may be modified to include only two camera modules. In addition, in some example embodiments, the camera module group 1100 may be modified to include k (k is a natural number of 4 or more) camera modules and/or in different configurations.

Hereinafter, a detailed configuration of the camera module 1100*b* will be described with reference to FIG. 11. However, the following description may be equally applied to other camera modules 1100*a* and 1100*c* according to embodiments.

Referring to FIG. 11, the camera module 1100*b* may include a prism 1105, an optical path folding element (OPFE) 1110, an actuator 1130, an image sensing device 1140, and a storage 1150.

The prism 1105 may include a reflective surface 1107 of a light reflective material to change a path of light L incident from the outside.

In some example embodiments, the prism 1105 may change the path of the light L incident in a first direction X to a second direction Y perpendicular to the first direction X. In addition, the prism 1105 may rotate the reflective surface 1107 of the light reflective material in an A direction around a central axis 1106, or may rotate the central axis 1106 in a B direction to change the path of the light L incident in the first direction X to the second direction Y perpendicular to the first direction X. At this time, the OPFE 1110 may also move in a third direction Z perpendicular to the first direction X and the second direction Y.

In some example embodiments, as shown, the maximum angle of rotation of the prism 1105 in the A direction may be 15 degrees or less in a positive (+) A direction and greater than 15 degrees in a negative (−) A direction. However, some example embodiments are not limited thereto.

In some example embodiments, the prism 1105 may move around 20 degrees, between 10 degrees to 20 degrees, or between 15 degrees to 20 degrees in the positive (+) or negative (−) B direction, in which the prism 1105 may move at the same angle in the positive (+) or negative (−) B direction, or to a similar angle in a range of 1 degree.

In some example embodiments, the prism 1105 may move the reflective surface 1107 of the light reflective material in a third direction (for example, the Z direction) parallel to a direction in which the central axis 1106 extends.

The OPFE 1110 may include, for example, optical lenses consisting of m (m is a natural number) groups. The m lenses may move in the second direction Y to change an optical zoom ratio of the camera module 1100*b*. For example, assuming that a basic optical zoom magnification of the camera module 1100*b* is Z, when the m optical lenses included in the OPFE 1110 are moved, an optical zoom magnification of the camera module 1100*b* may be changed to 3Z, 5Z, or 5Z or more.

The actuator 1130 may move the OPFE 1110 or an optical lens to a specific position. For example, the actuator 1130 may adjust a position of the optical lens so that the image sensor 1142 is positioned at a focal length of the optical lens for accurate sensing.

The image sensing device 1140 may include the image sensor 1142, a control logic 1144, and memory 1146. The image sensor 1142 may sense an image to be sensed by using the light L provided through the optical lens. The image sensor 1142 may generate image data having a HDR by merging HCG image data with LCG image data. Furthermore, based on the reference ramp signal RAMP generated by one ramp signal generator 130 (refer to FIG. 1), by using a first ramp signal RAMP1 and a second ramp signal RAMP2 having a clock and/or different offset values according to the analog gain in the HCG mode, image data having a higher operating range may be generated.

The control logic 1144 may control an overall operation of the camera module 1100*b*. For example, the control logic 1144 may control the operation of the camera module 1100*b* according to a control signal provided through a control signal line CSLb. The control logic 1144 may control operations of the output bit selector 131, the ramp clock controller 132, the ramp offset controller 133, and the clock divider 134 of the ramp signal generator 130 described with reference to FIGS. 5A to 5D. For example, the output bit of the image signal to be read out according to the preset (or, alternatively, generated or desired) display resolution (or the analog gain of the ramp signal for each mode in DCG mode (for example, the slope gain of the ramp signal for each mode)) is selected, and the clock and offset value of the ramp signal in the conversion gain mode (for example, the HCG mode) may be set to correspond to the selected output bit.

The memory 1146 may store information required for the operation of the camera module 1100*b* such as calibration data 1147. The calibration data 1147 may include information required for the camera module 1100*b* to generate image data by using the light L provided from the outside. The calibration data 1147 may include, for example, information on the degree of rotation, information on the focal length, and information on the optical axis. When the camera module 1100*b* is implemented in the form of a multi-state camera in which the focal length changes according to the position of the optical lens, the calibration data 1147 may include information on a focal length value for each position (or state) of the optical lens and auto-focusing.

The storage 1150 may store the image data sensed by the image sensor 1142. The storage 1150 may be arranged outside the image sensing device 1140 and may be implemented in a stacked form with a sensor chip constituting the image sensing device 1140. In some example embodiments, the storage 1150 may be implemented as an electrically erasable programmable read-only memory (EEPROM). However, example embodiments are not limited thereto.

Referring to FIGS. 10 and 11 together, in some example embodiments, each of the plurality of camera modules 1100*a*, 1100*b*, and 1100*c* may include the actuator 1130. Accordingly, each of the plurality of camera modules 1100*a*, 1100*b*, and 1100*c* may include the same or different calibration data 1147 according to the operation of the actuator 1130 included therein.

In some example embodiments, one of the plurality of camera modules 1100*a*, 1100*b*, and 1100*c* (for example, 1100*b*) may include a camera module in the form of a folded lens including the prism 1105 and the OPFE 1110 described above, and the remaining camera modules (for example, 1100*a* and 1100*c*) may include vertical camera modules that do not include the prism 1105 and the OPFE 1110. However, example embodiments are not limited thereto.

In some example embodiments, one of the plurality of camera modules 1100*a*, 1100*b*, and 1100*c* (for example, 1100*c*) may include, for example, a vertical depth camera extracting depth information by using infrared ray (IR). In this case, the application processor 1200 may merge image data provided by the depth camera with image data provided by another camera module (for example, 1100*a* or 1100*b*) to generate a 3D depth image.

In some example embodiments, at least two camera modules (for example, 1100*a* and 1100*b*) among the plurality of camera modules 1100*a*, 1100*b*, and 1100*c* may have different fields of view. In this case, for example, the at least two camera modules (for example, 1100*a* and 1100*b*) among the plurality of camera modules 1100*a*, 1100*b*, and 1100*c* may have different optical lenses. However, the inventive concepts are not limited thereto.

In addition, in some example embodiments, the plurality of camera modules 1100*a*, 1100*b*, and 1100*c* may have different fields of view. In this case, the plurality of camera modules 1100*a*, 1100*b*, and 1100*c* may have different optical lenses. However, the inventive concepts are not limited thereto.

In some example embodiments, the plurality of camera modules 1100*a*, 1100*b*, and 1100*c* may be physically separated from one another. That is, a sensing region of the image sensor 1142 is not divided and used by the plurality of camera modules 1100*a*, 1100*b*, and 1100*c*, but an independent image sensor 1142 may be arranged in each of the plurality of camera modules 1100*a*, 1100*b*, and 1100*c*.

Referring back to FIG. 10, the application processor 1200 may include an image processing device 1210, a memory controller 1220, and internal memory 1230. The application processor 1200 may be implemented separately from the plurality of camera modules 1100*a*, 1100*b*, and 1100*c*. For example, the application processor 1200 and the plurality of camera modules 1100*a*, 1100*b*, and 1100*c* may be implemented separately from one another as separate semiconductor chips.

The image processing device 1210 may include a plurality of sub-image processors 1212*a*, 1212*b*, and 1212*c*, an image generator 1214, and a camera module controller 1216.

The image processing device 1210 may include the plurality of sub-image processors 1212*a*, 1212*b*, and 1212*c* of which number corresponds to the number of camera modules 1100*a*, 1100*b*, and 1100*c*.

Image data items generated by the plurality of camera modules 1100*a*, 1100*b*, and 1100*c* may be provided to the corresponding sub-image processors 1212*a*, 1212*b*, and 1212*c* through image signal lines ISLa, ISLb, and ISLc separated from one another. For example, the image data generated by the camera module 1100*a* may be provided to the sub-image processor 1212*a* through the image signal line ISLa, the image data generated by the camera module 1100*b* may be provided to the sub-image processor 1212*b* through the image signal line ISLb, and the image data generated by the camera module 1100*c* may be provided to the sub-image processor 1212*c* through the image signal line ISLc. Such image data transmission may be performed by using, for example, a camera serial interface (CSI) based on a mobile industry processor interface (MIPI). However, example embodiments are not limited thereto.

Meanwhile, in some example embodiments, one sub-image processor may be arranged to correspond to the plurality of camera modules. For example, the sub-image processor 1212*a* and the sub-image processor 1212*c* are not implemented separately from each other as shown, but implemented integrated into one sub-image processor, and image data provided by the camera module 1100*a* and the camera module 1100*c* may be selected by a selection element (for example, a multiplexer) and may be provided to the integrated sub-image processor.

The image data provided to each of the sub-image processors 1212*a*, 1212*b*, and 1212*c* may be provided to the image generator 1214. The image generator 1214 may generate an output image by using the image data provided by each of the sub-image processors 1212*a*, 1212*b*, and 1212*c* according to image generation formation or a mode signal.

Specifically, the image generator 1214 may merge at least some of the image data items generated by the plurality of camera modules 1100*a*, 1100*b*, and 1100*c* having different fields of view with one another according to the image generation information or the mode signal to generate the output image. In addition, the image generator 1214 may select one of the image data items generated by the plurality of camera modules 1100*a*, 1100*b*, and 1100*c* having different fields of view with one another according to the image generation information or the mode signal to generate the output image.

In some example embodiments, the image generation information may include a zoom signal or a zoom factor. In addition, in some example embodiments, the mode signal may be based on, for example, a mode selected by a user.

When the image generation information is the zoom signal (the zoom factor), and the plurality of camera modules 1100*a*, 1100*b*, and 1100*c* have different fields of view, the image generator 1214 may perform different operations according to a type of the zoom signal. For example, when the zoom signal is a first signal, after merging the image data output from the camera module 1100*a* with the image data output from the camera module 1100*c*, the output image may be generated by using the merged image signal and the image data output from the camera module 1100*b* that is not used for merging. When the zoom signal is a second signal different from the first signal, the image generator 1214 may select one of the image data items output from the plurality of camera modules 1100*a*, 1100*b*, and 1100*c* without merging the image data items to generate the output image.

However, example embodiments are not limited thereto, and a method of processing the image data may be modified and implemented as needed.

In some example embodiments, the image generator 1214 may receive a plurality of image data items having different exposure times from at least one of the plurality of sub-image processors 1212*a*, 1212*b*, and 1212*c*, and may perform HDR processing on the plurality of image data items to generate merged image data with an increased dynamic range.

The camera module controller 1216 may provide control signals to the plurality of camera modules 1100*a*, 1100*b*, and 1100*c*. The control signals generated by the camera module controller 1216 may be provided to the plurality of corresponding camera modules 1100*a*, 1100*b*, and 1100*c* through separate control signal lines CSLa, CSLb, and CSLc, respectively.

One of the plurality of camera modules 1100*a*, 1100*b*, and 1100*c* may be designated as a master camera module (for example, 1100*b*) according to the image generation information or the mode signal including the zoom signal, and the remaining camera modules (for example, 1100*a* and 1100*c*) may be designated as slave camera modules. Such information may be included in the control signals and may be provided to the plurality of camera modules 1100*a*, 1100*b*, and 1100*c* through the control signal lines CSLa, CSLb, and CSLc separated from one another.

The camera modules operating as the master camera module and the slave camera modules may be changed according to the zoom factor or an operation mode signal. For example, when the field of view of the camera module 1100*a* is greater than that of the camera module 1100*b* and the zoom factor represents a low zoom magnification, the camera module 1100*b* may operate as the master camera module and the camera module 1100*a* may operate as the slave camera module. Conversely, when the zoom factor represents a high zoom magnification, the camera module 1100*a* may operate as the master camera module, and the camera module 1100*b* may operate as the slave camera module.

In some example embodiments, the control signals provided by the camera module controller 1216 to the plurality of camera modules 1100*a*, 1100*b*, and 1100*c* may include a sync enable signal. For example, when the camera module 1100*b* is the master camera module and the camera modules 1100*a* and 1100*c* are the slave camera modules, the camera module controller 1216 may transmit the sync enable signal to the camera module 1100*b*. The camera module 1100*b* receiving the sync enable signal may generate a sync signal based on the received sync enable signal and may provide the generated sync signal to the camera modules 1100*a* and 1100*c* through a sync signal line SSL. The camera module 1100*b* and the camera modules 1100*a* and 1100*c* may be synchronized with the sync signal to transmit the image data to the application processor 1200.

In some example embodiments, the control signals provided by the camera module controller 1216 to the plurality of camera modules 1100*a*, 1100*b*, and 1100*c* may include mode information according to the mode signal. Based on the mode information, the plurality of camera modules 1100*a*, 1100*b*, and 1100*c* may operate in a first operation mode and a second operation mode in relation to a sensing speed.

The plurality of camera modules 1100*a*, 1100*b*, and 1100*c* may generate an image signal at a first speed (for example, at a first frame rate), may encode the generated image signal at a second speed higher than the first speed (for example, at a second frame rate higher than the first frame rate), and may transmit the encoded image signal to the application processor 1200 in the first operation mode. At this time, the second speed may be 30 times or less of the first speed.

The application processor 1200 may store the received image signal, that is, the encoded image signal, in the internal memory 1230 in the application processor 1200 or the external memory 1400 outside the application processor 1200, may read out the encoded image signal from the internal memory 1230 or the external memory 1400, and may display the image data generated based on the decoded image signal. For example, a corresponding sub-processor among the plurality of sub-image processors 1212*a*, 1212*b*, and 1212*c* of the image processing device 1210 may perform decoding, and may also perform image processing on the decoded image signal.

The plurality of camera modules 1100*a*, 1100*b*, and 1100*c* may generate the image signal at a third speed lower than the first speed (for example, at a third frame rate lower than the first frame rate) and may transmit the image signal to the application processor 1200 in the second operation mode. The image signal provided to the application processor 1200 may include an unencoded signal. The application processor 1200 may perform image processing on the received image signal or may store the image signal in the internal memory 1230 or the external memory 1400.

The PMIC 1300 may supply power, for example, a power voltage, to each of the plurality of camera modules 1100*a*, 1100*b*, and 1100*c*. For example, under control of the application processor 1200, the PMIC 1300 may supply first power to the camera module 1100*a* through a power signal line PSLa, may supply second power to the camera module 1100*b* through a power signal line PSLb, and may supply third power to the camera module 1100*c* through a power signal line PSLc.

The PMIC 1300 may generate power corresponding to each of the plurality of camera modules 1100*a*, 1100*b*, and 1100*c*, and may adjust a level of the power in response to a power control signal PCON from the application processor 1200. The power control signal PCON may include a power control signal for each operation mode of the plurality of camera modules 1100*a*, 1100*b*, and 1100*c*. For example, the operation mode may include a low power mode. At this time, the power control signal PCON may include information on a camera module operating in a low power mode and a set power level. Levels of power components provided to the plurality of camera modules 1100*a*, 1100*b*, and 1100*c* may be the same as or different from one another. In addition, the levels of the power components may dynamically change.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., +10%) around the stated numerical values or shapes.

As described herein, any electronic devices and/or portions thereof according to any of the example embodiments may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality and/or methods performed by some or all of any devices, systems, modules, units, controllers, circuits, architectures, and/or portions thereof according to any of the example embodiments, and/or any portions thereof.

While the inventive concepts have been particularly shown and described with reference to example embodiments thereof, it will be understood that various changes in form and details may be made therein without departing from the spirit and scope of the following claims.

What is claimed is:

1. A ramp signal generator comprising:

a clock divider configured to generate a plurality of ramp clocks having different clocks;

an output bit selector configured to select an output bit for reading out a pixel signal based on an analog gain of a ramp signal;

a ramp clock controller configured to set a clock corresponding to the output bit, from among the plurality of ramp clocks, as a selected ramp clock; and a ramp offset controller configured to set an offset value corresponding to the output bit, from among a plurality of offset values, as a ramp offset value.

2. The ramp signal generator of claim 1, wherein the clock divider is further configured to divide a count clock according to an analog gain for each conversion gain mode to generate the plurality of ramp clocks.

3. The ramp signal generator of claim 2, wherein the ramp clock controller comprises at least one multiplexer configured to output one of the plurality of ramp clocks as the selected ramp clock in response to receiving a clock selection signal, and the clock selection signal is generated based on the output bit.

4. The ramp signal generator of claim 1, wherein the clock divider comprises at least one D flip-flop configured to receive an input of a count clock and to output the plurality of ramp clocks.

5. The ramp signal generator of claim 1, wherein the output bit selector comprises at least one AND gate element configured to receive an inverted dual conversion gain mode signal and an option selection signal and to output the selected output bit, and the option selection signal is generated based on the analog gain.

6. The ramp signal generator of claim 1, wherein the ramp offset controller comprises at least one multiplexer configured to output one of the plurality of offset values as the ramp offset value in response to receiving an offset selection signal, and the offset selection signal is generated based on the output bit.

7. The ramp signal generator of claim 1, wherein the ramp signal generator supports a dual conversion gain (DCG) mode, and the DCG mode includes a high conversion gain (HCG) mode and a low conversion gain (LCG) mode.

8. The ramp signal generator of claim 7, wherein an auto-zero level of a ramp signal in the HCG mode is same as an auto-zero level of a ramp signal in the LCG mode.

9. An image sensor comprising:

a pixel array including a plurality of pixels;

a ramp signal generator configured to generate ramp signals having different clocks according to a conversion gain mode; and a correlated double sampler configured to compare one of the ramp signals with an output signal of the pixel array and to output a comparison signal, the ramp signal generator further configured to output a first ramp signal in a high conversion gain (HCG) mode of the conversion gain mode and output a second ramp signal in a low conversion gain (LCG) mode of the conversion gain mode, the ramp signal generator including an inverter, a first AND gate, and a second AND gate, the first AND gate and the second AND gate configured to receive an output of the inverter, the first AND gate configured to receive an option signal which varies based on the HCG mode and the LCG mode.

10. The image sensor of claim 9, wherein an auto-zero level of the first ramp signal is same as an auto-zero level of the second ramp signal.

11. The image sensor of claim 9, wherein the ramp signal generator is further configured to generate the first ramp signal based on a first analog gain and generate the second ramp signal based on a second analog gain, and the first analog gain is greater than the second analog gain.

12. The image sensor of claim 11, wherein the ramp signal generator is further configured to select a first output bit for reading out the plurality of pixels in the HCG mode based on the first analog gain and select a second output bit for reading out the plurality of pixels in the LCG mode based on the second analog gain.

13. The image sensor of claim 12, wherein the ramp signal generator is further configured to set a clock of the first ramp signal as a first clock corresponding to the first output bit and set a clock of the second ramp signal as a second clock corresponding to the second output bit.

14. The image sensor of claim 13, wherein the second clock is higher than the first clock.

15. The image sensor of claim 12, wherein the ramp signal generator is further configured to set an offset value of the first ramp signal as a first offset value corresponding to the first output bit and set an offset value of the second ramp signal as a second offset value corresponding to the second output bit.

16. An operating method of a ramp signal generator, the operating method comprising:

generating a plurality of ramp clocks having different clocks;

selecting an output bit for reading out a pixel based on an analog gain in a conversion gain mode;

setting a clock corresponding to the output bit, from among the plurality of ramp clocks, as a selected ramp clock;

setting an offset value corresponding to the output bit, from among a plurality of offset values, as a ramp offset; and outputting a ramp signal having the selected ramp clock and the offset value.

17. The operating method of claim 16, wherein the generating of the plurality of ramp clocks comprises dividing and generating a count clock based on the analog gain in the conversion gain mode.

18. The operating method of claim 16, wherein the selecting of the output bit comprises:

selecting a first output bit according to a first analog gain in an HCG mode, and selecting a second output bit according to a second analog gain in an LCG mode, and the first analog gain is greater than the second analog gain.

19. The operating method of claim 18, wherein the setting of the selected ramp clock comprises:

setting a first clock corresponding to the first output bit as an HCG selected ramp clock of the HCG mode, and setting a second clock corresponding to the second output bit as an LCG selected ramp clock of the LCG mode, and the second clock is higher than the first clock.

20. The operating method of claim 19, wherein the setting of the selected ramp clock comprises:

setting a first offset value corresponding to the first output bit as a ramp offset value of the HCG mode, and setting a second offset value corresponding to the second output bit as a ramp offset value of the LCG mode.

* * * * *